United States Patent
Martinez

(10) Patent No.: US 7,141,955 B1
(45) Date of Patent: Nov. 28, 2006

(54) APPARATUS AND METHOD FOR MONITORING CURRENT FOR A HIGH-SIDE SWITCH

(75) Inventor: Steve Martinez, Tucson, AZ (US)

(73) Assignee: National Semiconductor Corporation, Santa Clara, CA (US)

( * ) Notice: Subject to any disclaimer, the term of this patent is extended or adjusted under 35 U.S.C. 154(b) by 14 days.

(21) Appl. No.: 10/949,237

(22) Filed: Sep. 24, 2004

(51) Int. Cl.
*G05F 1/40* (2006.01)

(52) U.S. Cl. .................. 323/272; 323/224; 363/65; 307/66

(58) Field of Classification Search ........ 323/282–288, 323/224, 272–274, 222; 363/16–17, 44, 363/89, 132, 90, 65; 307/64–66
See application file for complete search history.

(56) References Cited

U.S. PATENT DOCUMENTS

| | | | |
|---|---|---|---|
| 6,246,220 B1 * | 6/2001 | Isham et al. | 323/224 |
| 6,717,787 B1 | 4/2004 | Barker | |
| 6,727,745 B1 | 4/2004 | Shearon et al. | |
| 6,806,689 B1 * | 10/2004 | Schuellein et al. | 323/272 |

OTHER PUBLICATIONS

Cheung Fai Lee et al., "On-Chip Current Sensing Technique for CMOS Monolithic Switch-Mode Power Converters", IEEE, vol. 5, May 26-29, 2002, pp. 265-268.

P. Givelin et al., "Application of a CMOS Current Mode Approach to On-Chip Current Sensing in Smart Power Circuits", IEEE, vol. 142, Issue 6, Dec. 1995, pp. 357-363.

Chucheng Xiao et al., "An Overview of Integratable Current Sensor Technologies", IEEE, vol. 2, Oct. 12-16, 2003, pp. 1251-1256.

P. Givelin et al., "On-Chip Overcurrent and Openload Detection for a Power MOS High-Side Switch: A CMOS Current Mode Approach", IEEE, vol. 2, Sep. 1993, pp. 197-200.

D. Grant et al., "Current Sensing MOSFETS for Protection and Control", IEEE, pp. 8/1-8/5.

H. P. Forghani-zadeh et al., "Current-Sensing Techniques for DC-DC Converters", IEEE, vol. 2, Aug. 4-7, 2002, pp. II-557-II-580.

* cited by examiner

*Primary Examiner*—Rajnikant B. Patel
(74) *Attorney, Agent, or Firm*—Darby & Darby PC; Matthew M. Gaffney

(57) ABSTRACT

A switching buck regulator circuit includes an n-type high-side switch. The driver of the high-side switch employs a boot voltage (Vcboot) as a power supply. Also, the output current is mirrored to a sense branch. A current sense voltage is generated employing a transistor in the sense branch. The current sense voltage is compared to a reference voltage that is generated employing another transistor having a gate that is coupled to the gate of the sense branch transistor. A diode (Dp) is coupled between the gate of the sense branch transistor and the input voltage (Vin). Another diode (Dc) is coupled between the gate of the sense branch transistor and Vcboot. When the high-side switch is off, the current sense voltage is clamped to substantially $Vin - V_{Dp} - V_{TN2}$. When the high-side switch is on, the gate voltage of the high-side switch is substantially given by $Vcboot - V_{Dc}$.

23 Claims, 4 Drawing Sheets

US 7,141,955 B1

APPARATUS AND METHOD FOR MONITORING CURRENT FOR A HIGH-SIDE SWITCH

FIELD OF THE INVENTION

The invention is related regulator circuits, and in particular, to an apparatus and method for a regulator circuit with current sensing in which the current-sense voltage is clamped while the high-side switch is off.

BACKGROUND OF THE INVENTION

It is common in the design of switching power supplies to utilize a high-side NMOS switch in order to deliver power from the input supply to the output filter. Switching power supplies that include a high-side NMOS switch sometimes include current sensing. Previously, such switching power supplies typically have had a large variation in the ratio of sensed current to output current. Additionally, the ratio typically has a degraded temperature response due to uncorrelated temperature drift.

BRIEF DESCRIPTION OF THE DRAWINGS

Non-limiting and non-exhaustive embodiments of the present invention are described with reference to the following drawings, in which.

DETAILED DESCRIPTION

Figure 1:
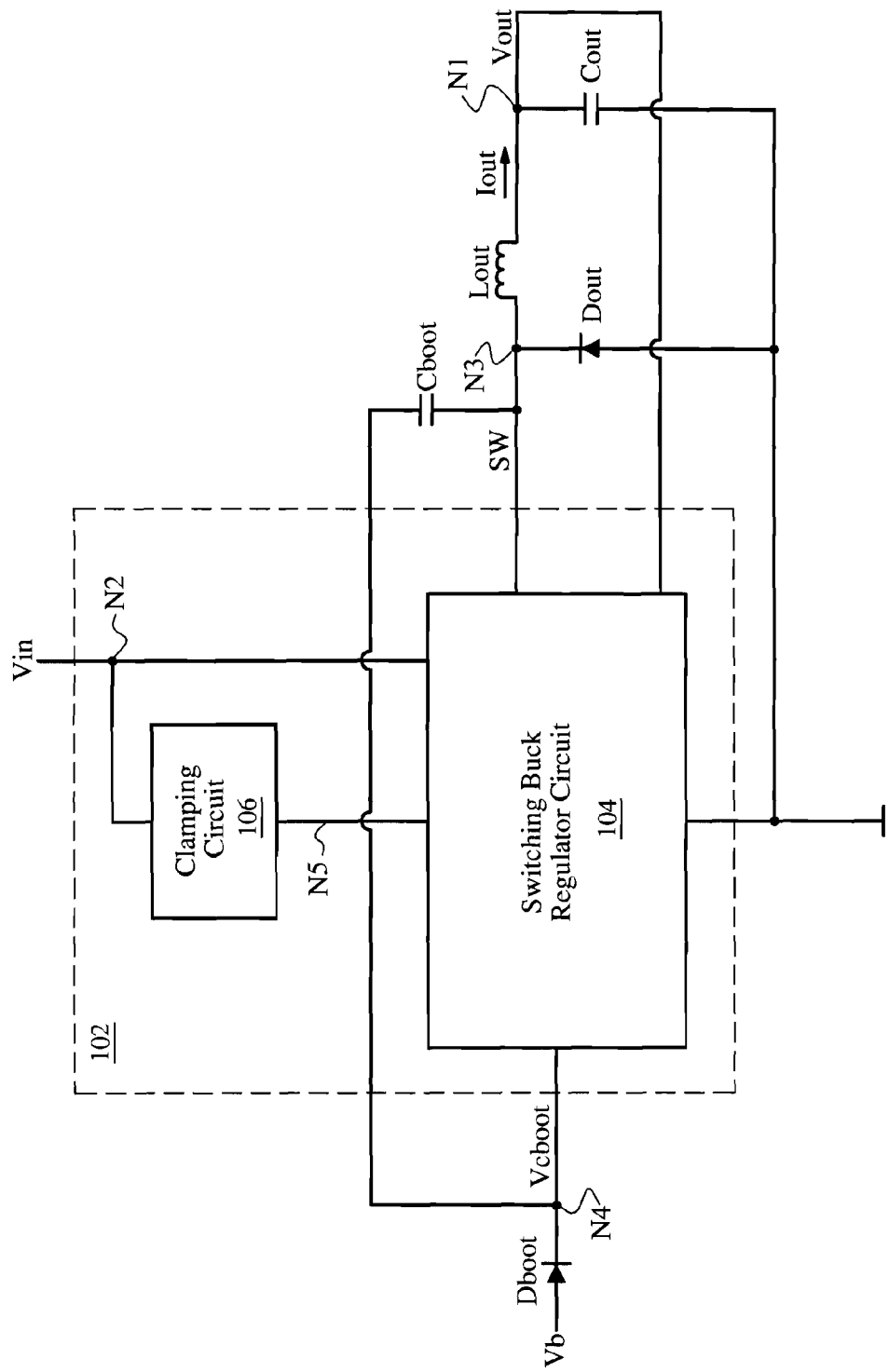
FIG. 1 shows a block diagram of an embodiment of a regulator circuit and external components.

Various embodiments of the present invention will be described in detail with reference to the drawings, where like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

Throughout the specification and claims, the following terms take at least the meanings explicitly associated herein, unless the context dictates otherwise. The meanings identified below do not limit the terms, but merely provide illustrative examples for the terms. The meaning of "a," "an," and "the" includes plural reference, and the meaning of "in" includes "in" and "on." The phrase "in one embodiment," as used herein does not necessarily refer to the same embodiment, although it may. The term "coupled" means at least either a direct electrical connection between the items connected, or an indirect connection through one or more passive or active intermediary devices. The term "circuit" means at least either a single component or a multiplicity of components, either active and/or passive, that are coupled together to provide a desired function. The term "signal" means at least one current, voltage, charge, temperature, data, or other signal. Where either a field effect transistor (FET) or a bipolar junction transistor (BJT) may be employed as an embodiment of a transistor, the scope of the words "gate", "drain", and "source" includes "base", "collector", and "emitter", respectively, and vice versa.

Briefly stated, the invention is related to a switching buck regulator circuit that includes an n-type high-side switch. The driver of the high-side switch employs a boot voltage (Vcboot) as a power supply. Also, the output current is mirrored to a sense branch. A current sense voltage is generated employing a transistor in the sense branch. The current sense voltage is compared to a reference voltage that is generated employing another transistor having a gate that is coupled to the gate of the sense branch transistor. A diode (Dp) is coupled between the gate of the sense branch transistor and the input voltage (Vin). Another diode (Dc) is coupled between the gate of the sense branch transistor and Vcboot. When the high-side switch is off, the current sense voltage is clamped to substantially $Vin-V_{Dp}-V_{TN}$. When the high-side switch is on, the gate voltage of the high-side switch is substantially given by $Vcboot-V_{Dc}$.

System Overview

FIG. 1 shows a block diagram of an embodiment of regulator circuit 102 and external components. The external components may include diode Dboot, boot capacitor Cboot, flywheel diode Dout, inductor Lout, and output capacitor Cout. Regulator circuit 102 includes switching buck regulator circuit 104 and clamping circuit 106.

Switching buck regulator circuit 104 may include an n-type transistor (not shown in FIG. 1) that is arranged to operate as a high-side switch. Capacitor Cboot is arranged to operate as a charge pump, providing boot voltage Vcboot. Voltage Vcboot is employed so that a gate-to-source voltage associated with the high-side switch can be maintained while the gate voltage associated with the high-side switch corresponds to a logic high.

Switching buck regulator circuit 104 is arranged to, in conjunction with other components illustrated in FIG. 1, regulate voltage Vout and/or current Iout. Switching buck regulator circuit 104 is further arranged to sense current Iout based, in part, on current sense voltage Vcs (not shown in FIG. 1), which is generated within switching buck regulator circuit 104. Also, clamping circuit 106 is arranged to clamp a voltage at node N5 if the high-side switch is open. By clamping the voltage at node N5, clamping circuit 106 (when the high-side switch is open) clamps voltage Vcs to a voltage level that is relatively near input voltage Vin.

Although one embodiment is illustrated in FIG. 1, many alternative embodiments are within the spirit and scope of the invention. In one embodiment, flywheel diode Dout is employed, as illustrated in FIG. 1. In other embodiments, diode Dout may be replaced with a synchronous switch, and the like.

In one embodiment, regulator circuit 102 is included in an integrated circuit, and components Dboot, Cboot, Dout, Lout, and Cout are external to regulator circuit 102 and the integrated circuit. In other embodiments, one or more of components Dboot, Cboot, Dout, Lout, and Cout may be included in regulator circuit 102 and the integrated circuit, rather than being external to regulator circuit 102 and the integrated circuit.

In one embodiment, regulator circuit 102 is arranged to regulate voltage Vout, and to provide over-current protection. In another embodiment, regulator circuit 102 is arranged to perform both voltage-mode regulation and current-mode regulation. In yet another embodiment, regulator circuit 102 is arranged to perform current regulation and not voltage regulation. In this embodiment, the direct connection between node N1 and switching buck regulator 104 need not be employed.

Figure 2:
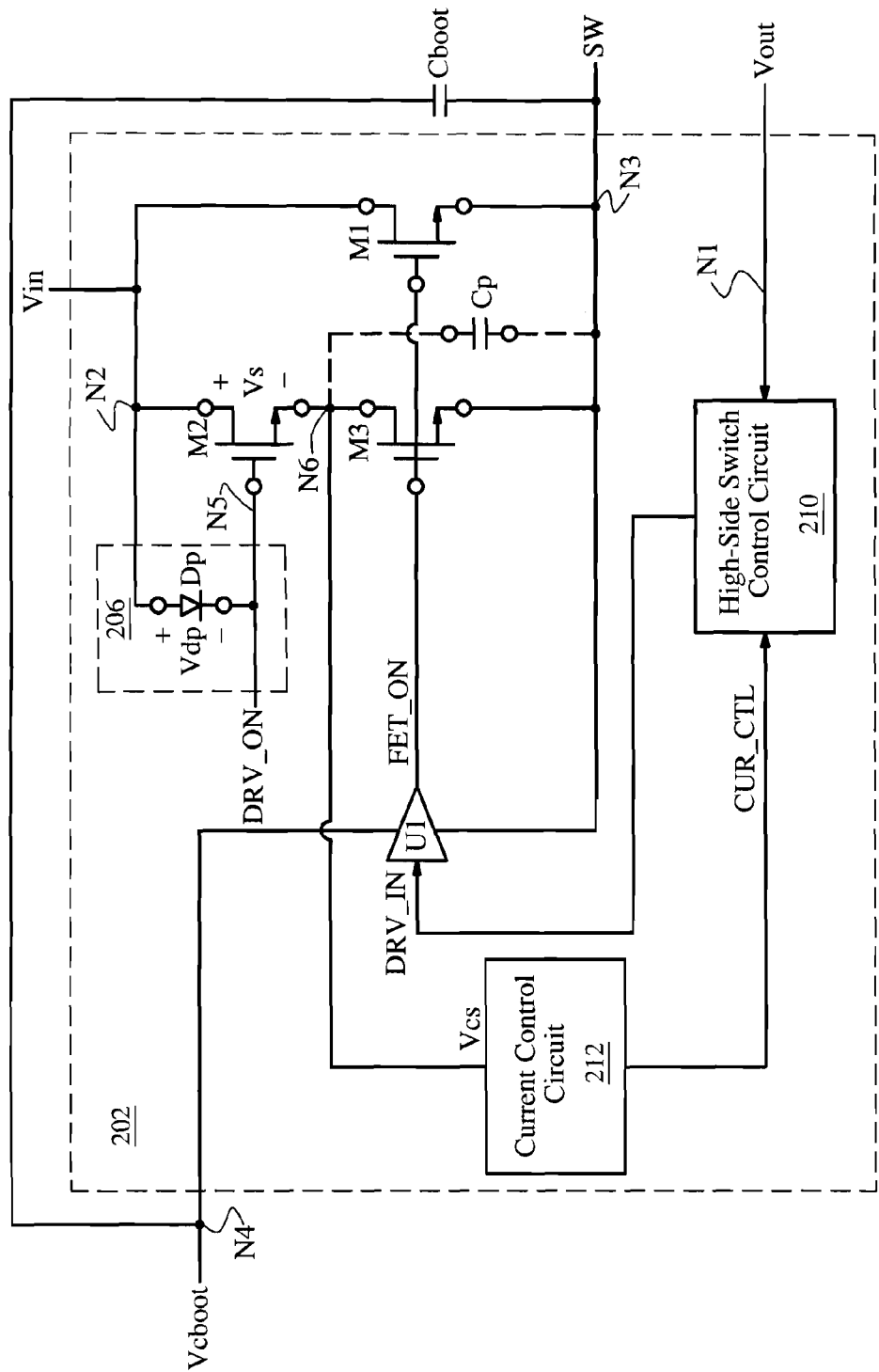
FIG. 2 illustrates a block diagram of an embodiment of the regulator circuit of FIG. 1.

FIG. 2 illustrates a block diagram of an embodiment of regulator circuit 202 and capacitor Cboot. Regulator circuit 202 may be employed as an embodiment of regulator circuit 102 of FIG. 1. Regulator circuit 202 includes clamping circuit 206, which may be employed as an embodiment of clamping circuit 106 of FIG. 1. In one embodiment, clamping circuit 206 includes diode circuit Dp. In one embodiment, diode circuit Dp includes a diode. In another embodiment, diode circuit Dp includes a transistor that is arranged to operate as a diode.

Regulator circuit 206 further includes transistors M1–M3, current control circuit 212, high-side switch control circuit 210, and driver circuit U1. FIG. 2 also illustrates parasitic capacitance Cp, which may represent a parasitic drain-to-source capacitance of transistor M3 rather than a circuit element.

In one embodiment, each of the transistors in regulator circuit 304 is a MOSFET. In other embodiments, one or more of the transistors in regulator circuit 304 may be a MESFET, JFET, BJT, or the like.

Current control circuit 212 is arranged to provide current control signal CUR_CTL based, in part, on current sense voltage Vcs. In one embodiment, current control circuit 212 is a current-limit comparator. In another embodiment, current control circuit 212 is an error amplifier.

High-side switch control circuit 210 may be arranged to perform pulse modulation, such as pulse width modulation or pulse frequency modulation.

In one embodiment, regulator circuit 202 is arranged to regulate voltage Vout, and to provide over-current protection. In this embodiment, high-side switch control circuit 210 is arranged to provide signal DRV_IN based on pulse modulation of a feedback voltage that is based on voltage Vout. Also, in this embodiment, high-side switch control circuit 210 is arranged to de-assert signal DRV_IN if signal CUR_CTL is asserted, which indicates an over-current condition.

In another embodiment, high-side switch control circuit 210 is arranged for current-mode regulation. In this embodiment, high-side switch control circuit is arranged to provide signal DRV_IN based on pulse modulation of signal CUR_CTL during the current-mode regulation.

Driver circuit U1 is arranged to drive high-side switch transistor M1 (and sense transistor M3) by providing signal FET_ON based on signal DRV_IN. As shown in FIG. 2, driver circuit U1 employs signal SW as a lower power supply, and employs boot voltage Vcboot as an upper power supply.

High-side switch transistor M1 is arranged to operate as a high-side switch. Transistor M1 and sense transistor M3 are coupled together in a current mirror arrangement. Accordingly, transistor M3 provides a current that substantially corresponds to a pre-determined fraction of the current passing through transistor M1.

Figure 3:
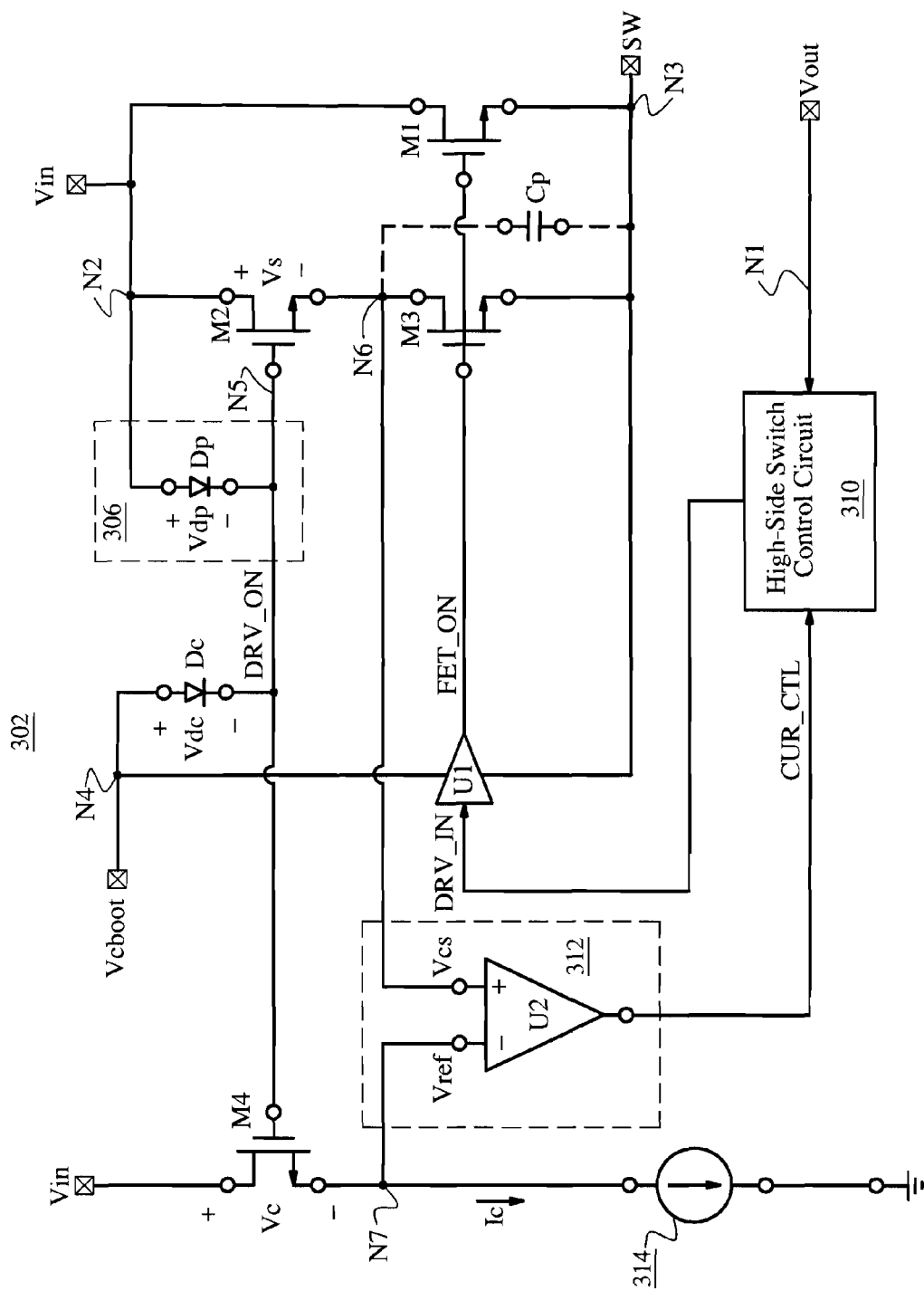
FIG. 3 shows a block diagram of an embodiment of the regulator circuit of FIG. 2 which includes another diode circuit.

Signal DRV_ON is provided to drive node N5 when transistor M3 is on. This way, transistor M2 turns on when transistor M3 is on. In one embodiment, as illustrated in FIG. 3 below, signal DRV_ON may be provided by a diode that is coupled between nodes N4 and N5. In other embodiments, signal DRV_ON may be provided in a different manner.

Operation when DRV_IN Transitions from High to Low

When signal DRV_IN transitions from high to low, transistors M3 and M1 turn off, allowing the voltage at node N3 to quickly fall below ground until diode Dout conducts to ground. The dV/dt of node N3 then couples through parasitic capacitance Cp to the $V_S$ potential, forcing it to increase. Voltage Vcboot also falls due to node N3 coupling through capacitor Cboot. Diode circuit Dp clamps the gate of sense branch transistor M2 a diode drop below PVIN. With the gate of M2 clamped, $V_S$ is clamped at $V_S = Vdp + V_{TN2}$.

Operation when DRV_IN Transitions From Low to High

When signal DRV_IN transitions from low to high, transistors M1 and M3 turn on, raising the voltage at nodes N3 and N4. When voltage Vcboot exceeds voltage Vin, diode circuit Dp turns off. At this point, transistors M1 and M3 turn on.

Since the swing of voltage $V_S$ is clamped during the off-state, the settling time necessary for voltage $V_S$ is relatively short.

Description of a Preferred Embodiment

FIG. 3 shows a block diagram of an embodiment of regulator circuit 302 that includes another diode circuit. Regulator circuit 302 may be employed as an embodiment of regulator circuit 202. Regulator circuit 302 further includes diode circuit Dc, transistor M4, and current source 314. An embodiment of current control circuit 312 includes current-limit comparator circuit U2.

Transistor M2 is configured to substantially provide an on-resistance ($R_{DS2}$), and reference transistor M4 is configured to substantially provide another on-resistance ($R_{DS4}$). The gates of transistors M2 and M4 are coupled together at node N5, and node N5 is clamped at Vcboot−Vdc when transistors M1 and M3 are on. Voltage Vcboot−Vdc is relatively near Vcboot, and the gate of transistor M3 corresponds to substantially Vcboot when transistor M3 is on. Accordingly, transistors M2, M3, and M4 are similarly biased.

Current source 314 is configured to provide current Ic. Current-limit comparator circuit U2 is arranged to compare voltage Vcs with voltage Vref. If votlage Vcs exceeds voltage Vref, signal CUR_CTL is asserted, indicating an over-current condition.

When signal DRV_IN transitions from high to low, voltage Vcboot decreases due to node N3 coupling through capacitor Cboot, as previously discussed. As voltage Vcboot falls below voltage Vin, diode circuit Dc shuts off.

When signal DRV_IN transitions from low to high, voltage Vcboot increases, as previously discussed. When voltage Vcboot exceeds voltage Vin, diode circuit Dc conducts, and diode circuit Dp turns off. The gate potential of transistors M2 and M4 is then substantially equal to Vcboot−Vdc, turning these devices on. High voltage operation can be exploited since the gate-to-source voltage of transistor M2 is limited in both states (Vcboot−Vdc in the on-state; Vtn in the off-state).

Threshold Current

Figure 4:
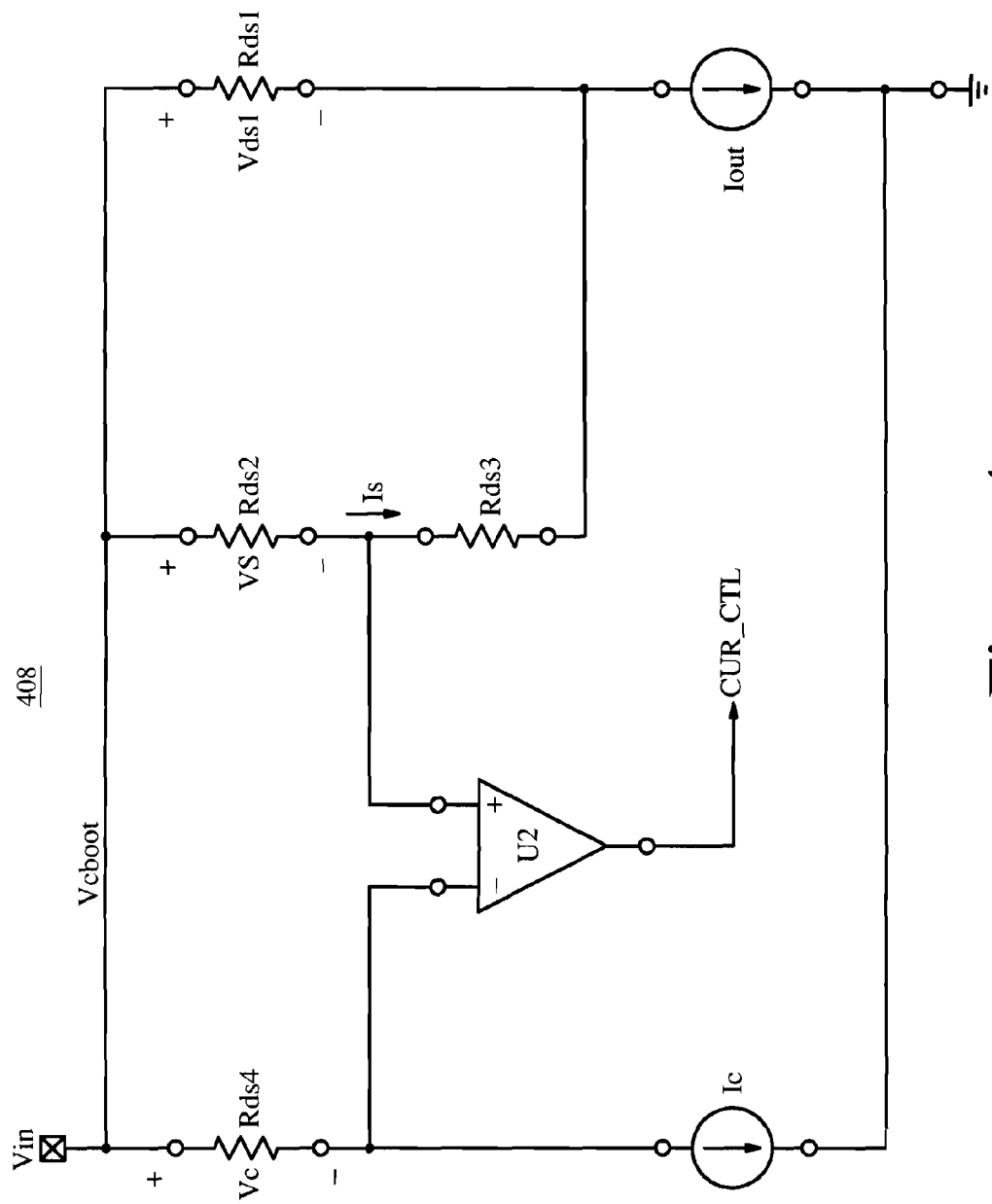
FIG. 4 schematically illustrates a model of a portion of the regulator circuit of FIG. 2 during an on-state for steady-state analysis, in accordance with aspects of the invention.

FIG. 4 schematically illustrates model 408 of an embodiment of a portion of regulator circuit 302 of FIG. 3 during an on-state for steady-state analysis.

In order to obtain an expression for the threshold current, an analysis of the steady-state operation of this circuit in the on-state may be employed. This state can be modeled as shown in FIG. 4, where $R_{DS}$ refers to the equivalent drain-to-source resistance of the MOS devices operating in triode.

For this topology, the equation defining the current threshold is derived below:

Assuming $R_{DS1} \ll (R_{DS2}+R_{DS3})$, then $$V_{DS1}=R_{DS1} \cdot I_{OUT} \quad \text{Eq1}$$

$$V_S = \left(\frac{R_{DS2}}{R_{DS2}+R_{DS3}}\right)(R_{DS1}) \quad \text{Eq2}$$

$$V_S = \left(\frac{R_{DS2}}{R_{DS2}+R_{DS3}}\right)(R_{DS1} \cdot I_{OUT}) \quad \text{Eq3}$$

At the threshold point, $$V_S = V_C \quad \text{Eq4}$$

$$I_C \cdot R_{DS4} = I_S \cdot R_{DS2} \quad \text{Eq5}$$

$$I_S = \frac{V_S}{R_{DS2}} = \left(\frac{R_{DS2}}{R_{DS2}+R_{DS3}}\right)\left(\frac{R_{DS1} \cdot I_{OUT,TH}}{R_{DS2}}\right) \quad \text{Eq6}$$

$$I_S = \left(\frac{R_{DS1} \cdot I_{OUT,TH}}{R_{DS2}+R_{DS3}}\right) \quad \text{Eq7}$$

$$I_C \cdot R_{DS4} = \left(\frac{R_{DS1} \cdot I_{OUT,TH}}{R_{DS2}+R_{DS3}}\right) + R_{DS2} \quad \text{Eq8}$$

Isolating the threshold current, $$I_{OUT,TH} = I_C \cdot \left(\frac{R_{DS4}}{R_{DS2}}\right)\left(\frac{R_{DS2}+R_{DS3}}{R_{DS1}}\right) \quad \text{Eq9}$$

Although the triode FET resistances are not necessarily well matched considering the large size discrepancies necessary, current $I_c$ can be adjusted to set the desired threshold. The thermal response of the threshold may be further compensated in one embodiment. As given by the triode resistance equation, $$R_{DS,ON} \cong \frac{1}{2k(V_{GS}-V_T)}; \text{ where } k = \frac{\mu_n \cdot C_{OX} \cdot W}{2L} \quad \text{Eq10}$$

Due to similar biasing, $R_{DS2}$ and $R_{DS4}$ share the same temperature coefficient (TC), and $R_{DS1}$ and $R_{DS3}$ share the same TC. Therefore, the net TC due to the resistor portion of (Eq9) is negative since the VGS of transistor M2 has a positive TC due to the level-shifting of diode circuit $D_C$. In one embodiment, current source 314 is arranged to compensate for the negative TC by providing current $I_c$ with a positive TC.

The above specification, examples and data provide a description of the manufacture and use of the composition of the invention. Since many embodiments of the invention can be made without departing from the spirit and scope of the invention, the invention also resides in the claims hereinafter appended.

What is claimed is:

1. A circuit for regulating an output signal, comprising:
   a switching buck regulator circuit that is coupled to an input node, wherein the switching buck regulator circuit is arranged to regulate the output signal, and to provide current sensing based, in part, on a current sense voltage; and wherein the switching buck regulator circuit includes a high-side switch; and
   a clamping circuit that is arranged to clamp the current sense voltage at the current sense node to a voltage level that is relatively near an input voltage at the input node if the high-side switch is open, wherein the high-side switch includes a high-side switch transistor; and wherein the switching buck regulator circuit further includes:
   a sense transistor that is coupled to the high-side switch transistor in a current mirror arrangement, wherein the sense transistor is coupled to a current sense node, and wherein the high-side switch transistor is coupled to a switch node;
   a sense branch transistor that is coupled between the current sense node and the input voltage node, wherein the sense branch transistor includes a gate, and wherein the current sense voltage is provided at the current sense node; and
   a current control circuit that is coupled to the current sense node.

2. The circuit of claim 1, wherein the clamping circuit includes a diode circuit that is coupled between the gate of the sense branch transistor and the input node, wherein the diode circuit includes at least one of a diode and a transistor that is configured to operate as a diode.

3. The circuit of claim 2, wherein the switching buck regulator circuit further includes:
   a driver circuit that is arranged to drive a gate of the high-side switch transistor based, in part, on the output signal, wherein the driver circuit includes a power supply input that is coupled to a boot node, and wherein the driver circuit is configured to operate with an external boot capacitor coupled between the switch node and the boot node.

4. The circuit of claim 3, further comprising another diode circuit that is coupled between the boot node and a gate of the sense branch transistor.

5. The circuit of claim 1, wherein the switching buck regulator circuit further includes a reference transistor that is coupled between the input voltage node and a reference node, wherein the current control circuit is further coupled to the reference node.

6. The circuit of claim 5, wherein the current control circuit includes an error amplifier circuit that is arranged to control the driver circuit based, in part, on a difference between a voltage at the current sense node and a voltage at the reference node.

7. The circuit of claim 5, wherein the current control circuit includes a current-limit comparator, and wherein the current-limit comparator is arranged to assert an overcurrent signal if a voltage at the current sense node approximately exceeds a voltage at the reference node.

8. The circuit of claim 7, wherein the switching buck regulator circuit further includes:
   a driver circuit that is arranged to drive the gate of the high-side switch transistor based, in part, on a driver circuit input signal;

an inductor that is coupled between the switch node and an output node, wherein the output signal is provided at the output node; and a high-side switch control circuit that is arranged to provide the driver input signal based, in part, on a pulse modulation that is based on a voltage of the output signal, and further arranged to operate such that the high-side switch circuit is substantially turned off if the over-current signal is asserted.

9. The circuit of claim 5, wherein the switching buck regulator circuit further includes a reference current source circuit that is coupled to the reference node.

10. A circuit for regulating an output signal, comprising:
a switching buck regulator circuit that is coupled to an input node, wherein the switching buck regulator circuit is arranged to regulate the output signal, and to provide current sensing based, in part, on a current sense voltage; and wherein the switching buck regulator circuit includes a high-side switch; and
a clamping circuit that is arranged to clamp the current sense voltage at the current sense node to a voltage level that is relatively near an input voltage at the input node if the high-side switch is open, wherein the switching buck regulator further includes a reference current source that is configured to provide a reference current that is pre-determined based on a threshold current level for an output current according to the equation:

$$I_{OUT,TH} = I_C \cdot \left(\frac{R_{DS4}}{R_{DS2}}\right)\left(\frac{R_{DS2} + R_{DS3}}{R_{DS1}}\right),$$

and such that the reference current has a positive temperature coefficient that substantially compensates for a negative temperature coefficient of $R_{DS2}$, wherein $I_c$ represents the reference current, $I_{OUT,TH}$ represent the threshold current level, $R_{DS1}$ represents an on-resistance associated with a high-side switch transistor, $R_{DS2}$ represent an on-resistance associated with a current sense branch transistor, $R_{DS3}$ represents an on-resistance associated with a sense transistor, and $R_{DS4}$ represents an on-resistance associated with a reference transistor.

11. A regulator circuit, comprising:
a high-side switch control circuit that is arranged to provide a driver input signal based, in part, on an output signal;
a current mirror including a high-side switch transistor and a sense transistor, wherein the high-switch switch transistor and the sense transistor each include a gate, the sense transistor is coupled to a current sense node, and wherein the high-side switch transistor and the sense transistor are both coupled to a switch node;
a driver circuit that is arranged to drive the gate of the high-side switch transistor based on the driver input signal, wherein the driver circuit includes a power supply input that is coupled to a boot node;
a sense branch transistor that is coupled between the current sense node and an input voltage node, wherein the sense branch transistor includes a gate;
a reference transistor that is coupled between the input voltage node and a reference node, wherein the reference transistor includes a gate that is coupled to the gate of the sense branch transistor;

a current control circuit that includes a first input that is coupled to the current sense node, a second input that is coupled to the reference node, and an output that is coupled to the high-side switch logic circuit;
a diode circuit that is coupled between the gate of the sense branch transistor and the input voltage node; and
another diode circuit that is coupled between the boot node and the gate of the sense branch transistor.

12. The regulator circuit of claim 11, further comprising:
an inductor that is coupled between the switch node and an output node, wherein the output signal is provided at the output node; and
a reference current source that is coupled to the reference node,
wherein, the reference current source is configured to provide a reference current to the reference transistor such that the reference current has a positive temperature coefficient;
the high-side switch transistor further includes a drain and a source, wherein the source of the high-side switch transistor is coupled to the switch node; the high-side switch transistor is arranged to receive an input signal at the input node; the drain of the high-side switch transistor is coupled to the input node;
the sense transistor further includes a drain and a source; the gate of the sense transistor is coupled to the gate of the high-side switch transistor; the source of the sense transistor is coupled to the source of the high-side switch transistor; the drain of the sense transistor is coupled to the current sense node;
the sense branch transistor further includes a drain and a source; the source of the sense branch transistor is coupled to the current sense node; the drain of the current sense transistor is coupled to the input node;
the reference transistor further includes a drain and a source; the source of the reference transistor is coupled to the reference node;
the high-side switch control circuit includes an output, and further includes an input that is coupled to the switch node;
the driver circuit further includes a driver input that is coupled to the output of the high-side switch control circuit, another power supply input that is coupled to the switch node, and an output that is coupled to the gate of the high-side switch transistor; and wherein the driver circuit is configured to operate with an external boot capacitor coupled between the switch node and the boot node.

13. A method for regulating an output signal, comprising:
providing a driver input signal such that the driver input signal is based, in part, on the output signal;
employing the driver input signal to drive a high-side switch, wherein the high-side switch is coupled between an input voltage and a switch node, and wherein the output signal provided based, in part, on a switch node voltage at the switch node;
providing a sense current such that the sense current is substantially ratioed to a current associated with the high-side switch;
providing a current sense voltage from the sense current;
performing current control based, in part, on the current sense voltage; and
clamping the current sense voltage when the high-side switch is off, wherein clamping the current sense voltage when the high-side switch is off is accomplished such that the clamping prevents the current sense voltage from becoming too low when the high-side switch is off.

14. The method of claim 13,
wherein providing the driver input signal includes:
providing an error amplifier voltage that is based, in part, on a voltage of the output signal; and
performing a pulse modulation of the error amplifier voltage; and
wherein providing the driver input signal is performed such that providing the driver input signal is based on the pulse modulation, and further based on the current control such that the driver input signal is disabled if an over-current condition occurs.

15. The method of claim 13, wherein providing the driver input signal includes:
providing an error amplifier voltage based, in part, on the current sense voltage; and
providing the driver input signal by performing pulse modulation on the error amplifier voltage.

16. A method for regulating an output signal, comprising:
providing a driver input signal such that the driver input signal is based, in part, on the output signal;
employing the driver input signal to drive a high-side switch, wherein the high-side switch is coupled between an input voltage and a switch node, and wherein the output signal provided based, in part, on a switch node voltage at the switch node;
providing a sense current such that the sense current is substantially ratioed to a current associated with the high-side switch;
providing a current sense voltage from the sense current;
performing current control based, in part, on the current sense voltage; and
clamping the current sense voltage when the high-side switch is off, wherein
providing the sense current is accomplished with a sense transistor that is coupled in a current mirror arrangement with the high-side switch, and further coupled to a current sense node;
providing the current sense voltage is accomplished with a sense branch transistor that is coupled between the current sense node and the input voltage, wherein the current sense voltage is provided at the current sense node; and
wherein performing the current control includes:
providing a reference voltage by providing a reference current to a reference transistor; and
controlling a current associated with the output signal by performing at least one of:
providing an over-current signal based on a comparison of the reference voltage at the current sense voltage; or
providing an error voltage based on a difference between the reference voltage and the current sense voltage.

17. The method of claim 16, wherein clamping the current sense voltage includes clamping a gate of the sense branch transistor to approximately one diode drop below the input voltage if the high-side switch is off.

18. The method of claim 16, further comprising:
employing a capacitor to provide a boot voltage, wherein employing the driver input signal to drive the high-side switch is accomplished employing the boot voltage as a power supply; and
clamping a gate of the sense branch transistor to approximately a diode drop below the boot voltage if the high-side switch is on.

19. The method of claim 16, wherein providing the reference current is accomplished such that the reference current has a positive temperature coefficient that substantially compensates for a negative temperature coefficient that is associated with an on-resistance associated with the sense branch transistor.

20. The circuit of claim 1, wherein the clamping circuit includes a diode that is coupled to the input node.

21. The method of claim 13, wherein clamping the current sense voltage when the high-side switch is off includes clamping the current sense voltage to a voltage that is relatively near the input voltage when the high-side switch is off.

22. A method for regulating an output signal, comprising:
providing a driver input signal such that the driver input signal is based, in part, on the output signal;
employing the driver input signal to drive a high-side switch, wherein the high-side switch is coupled between an input voltage and a switch node, and wherein the output signal provided based, in part, on a switch node voltage at the switch node;
providing a sense current such that the sense current is substantially ratioed to a current associated with the high-side switch;
providing a current sense voltage from the sense current;
performing current control based, in part, on the current sense voltage; and
clamping the current sense voltage when the high-side switch is off, wherein clamping the current sense voltage is accomplished with a transistor that is coupled to the input voltage.

23. The method of claim 16, wherein clamping the current sense voltage when the high-side switch is off is accomplished such that the clamping prevents the current sense voltage from becoming too low when the high-side switch is off.

* * * * *

UNITED STATES PATENT AND TRADEMARK OFFICE
CERTIFICATE OF CORRECTION

PATENT NO. : 7,141,955 B1
APPLICATION NO. : 10/949237
DATED : November 28, 2006
INVENTOR(S) : Steve Martinez It is certified that error appears in the above-identified patent and that said Letters Patent is hereby corrected as shown below:

On the title page item (56), Col. 1 (U.S. Patent Documents); Line 2; After "6,717,787" delete "B1" and insert -- B2 --, therefor.

On the title page item (56), Col. 1 (U.S. Patent Documents); Line 3; After "6,727,745" delete "B1" and insert -- B2 --, therefor.

Column 3; Line 50 (Approx.); Delete "transitor" and insert -- transistor --, therefor.

Column 4; Line 42; Delete "votlage" and insert -- voltage --, therefor.

5 (Eq2); Line 8; Delete " $V_S = \left(\dfrac{R_{DS2}}{R_{DS2} + R_{DS3}}\right)(R_{DS1})$ " and insert -- $V_S = \left(\dfrac{R_{DS2}}{R_{DS2} + R_{DS3}}\right)(V_{DS1})$ --, therefor.

5 (Eq8); Line 35; Delete " $I_C \cdot R_{DS4} = \left(\dfrac{R_{DS1} \cdot I_{OUT,TH}}{R_{DS2} + R_{DS3}}\right) + R_{DS2}$ " and insert -- $I_C \cdot R_{DS4} = \left(\dfrac{R_{DS1} \cdot I_{OUT,TH}}{R_{DS2} + R_{DS3}}\right) \cdot R_{DS2}$ --, therefor.

Column 5; Line 60; Delete "VGS" and insert -- $V_{GS}$ --, therefor.

UNITED STATES PATENT AND TRADEMARK OFFICE
CERTIFICATE OF CORRECTION

PATENT NO. : 7,141,955 B1
APPLICATION NO. : 10/949237
DATED : November 28, 2006
INVENTOR(S) : Steve Martinez It is certified that error appears in the above-identified patent and that said Letters Patent is hereby corrected as shown below:

Column 7; Line 37; In Claim 10, delete "$I_c$" and insert -- $I_C$ --, therefor.

Signed and Sealed this

Tenth Day of April, 2007

JON W. DUDAS
*Director of the United States Patent and Trademark Office*